United States Patent
Hokenson

(10) Patent No.: US 7,176,707 B1
(45) Date of Patent: Feb. 13, 2007

(54) BACK SIDE COMPONENT PLACEMENT AND BONDING

(75) Inventor: Gary L. Hokenson, St. Paul, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/360,248

(22) Filed: Feb. 23, 2006

(51) Int. Cl.
*G01R 31/26* (2006.01)

(52) U.S. Cl. ...................................... 324/765

(58) Field of Classification Search ............. None
See application file for complete search history.

(56) References Cited

U.S. PATENT DOCUMENTS

| | | | |
|---|---|---|---|
| 4,963,414 A | 10/1990 | LeVasseur et al. | |
| 5,591,034 A * | 1/1997 | Ameen et al. | 439/91 |
| 5,616,888 A | 4/1997 | McLaughlin et al. | |
| 5,785,799 A * | 7/1998 | Culnane et al. | 156/379.7 |
| 5,870,286 A | 2/1999 | Butterbaugh et al. | |
| 5,930,117 A | 7/1999 | Gengel | |
| 6,201,701 B1 | 3/2001 | Linden et al. | |
| 6,226,183 B1 | 5/2001 | Weber et al. | |
| 6,295,200 B1 | 9/2001 | Schmidt | |
| 6,349,033 B1 | 2/2002 | Dubin et al. | |
| 6,400,013 B1 | 6/2002 | Tsuzaki et al. | |
| 6,432,497 B2 | 8/2002 | Bunyan | |
| 6,671,176 B1 | 12/2003 | Barcley | |
| 6,705,388 B1 | 3/2004 | Sorgo | |
| 2002/0012762 A1 | 1/2002 | Bunyan | |
| 2003/0189248 A1 | 10/2003 | Iwaki et al. | |
| 2004/0000711 A1 | 1/2004 | Barclay | |
| 2005/0029652 A1 | 2/2005 | Cuff et al. | |
| 2005/0225337 A1 | 10/2005 | Cram | |
| 2005/0241801 A1 | 11/2005 | Mitchell et al. | |

* cited by examiner

*Primary Examiner*—Ha Tran Nguyen
*Assistant Examiner*—Trung Q. Nguyen
(74) *Attorney, Agent, or Firm*—Oppenheimer Wolff & Donnelly LLP

(57) ABSTRACT

Where double sided circuit boards are utilized, having components on both sides, cooling is easily achieved by utilizing an appropriate thermal bonding agent which is both thermally conductive and electrically insulating. The thermal bonding agent is coupled to the circuit board in a manner which surrounds and encapsulates components on one side of the circuit board. Attached to the other side of the thermal bonding material is a heat sink, or other heat management device. By using this configuration, heat is easily transmitted from the electrical components to the heat sink, while not creating any electrical interference or shorts for circuit components in contact with the thermal bonding material.

17 Claims, 6 Drawing Sheets

BACK SIDE COMPONENT PLACEMENT AND BONDING

BACKGROUND OF THE INVENTION

The present invention relates to circuit card assemblies. More specifically, the present invention relates to a circuit card assembly which efficiently manages thermal energy so as to provide more optimal operation.

As is well understood, circuit boards traditionally carry multiple electronic components and related connection pathways. These components, by nature, create some thermal energy or heat during operation, which must be managed. Due to this characteristic, cooling or thermal management is yet an additional consideration when designing circuit boards. Ideally, the components are cooled in some manner while not effecting the electrical operation of the circuit(s).

Typical approaches to circuit cooling have involved heat sinks, fluid cooling systems, and cooling fans. A typical heat sink is a heat dissipating component which is often designed to maximize its surface area. This maximum surface area provides the most optimal mechanism to dissipate heat into the related atmosphere. Heat is often transmitted to the heat sink through a physical connection between the circuit board and the heat sink. As an alternative approach, liquid cooling systems provide a flow of cooling material through related components or structures which are positioned in close proximity to the electronic components. Most ideally, the electronic components are physically attached to this fluid cooling structure, so that heat dissipated from the components can easily be transferred to the fluid and carried away. Similarly, cooling fans are used in certain applications to circulate air past the electric components, thus allowing them to dissipate the heat into the immediate environment.

As is well understood, the management of heat typically requires a heat transmission path which is specifically designed to carry thermal energy away from the electrical components. Most often, this transmission path is created or generated by physical structures, which are in contact with the electrical components. Again, this is typically accomplished by having the heat sinks be physically attached to the circuit boards in some manner.

Electrical shorts and other interference is always a concern for any electrical device. As such, care must be taken to avoid shorts and undesired connections to any of the electrical components. Typically, this is avoided by utilizing non-conductive materials whenever contact is expected. Unfortunately, these non-conductive materials are typically not thermally conductive. As such, the use of these materials for heat management is not optimal.

Heat management is further complicated by the placement of electrical components. Electrical components are typically placed upon one side of the circuit board, while the back side simply contains conduction pathways and other appropriate connections. In this situation, it is fairly easy to provide a thermally conductive and electrically insulating material directly in contact with the back side of the circuit board to help carry heat away. This is made possible because electrical components do not exist on the back side, thus avoiding the possibility of shorting and other electrical problems. The thermally conductive and electrically insulating material can then be connected to a heat sink, or some other cooling structure.

In certain applications, however, the back side of the circuit board must be used to contain additional electronic components. Often these components include shunt resistors and decoupling capacitors, for example. As such, the attachment of the circuit boards directly to a heat sink, or the use of other thermal conduction materials is complicated by the existence of these back side components. Any additional structures that may be beneficial for dealing with heat also create the potential for both physical and electrical problems with the circuit board and the specific back side components. Thus, thermal management of these two-sided circuit boards is difficult and not easily accomplished.

BRIEF SUMMARY OF THE INVENTION

The present invention provides a workable solution for thermal management in systems using two-sided circuit boards by incorporating a thermal bonding agent which couples the circuit board with a suitable heat sink. The thermal bonding agent is substantially thermally conductive, thus allowing heat to be transferred from the circuit board (and the attached electronic components) to the heat sink. Ultimately, heat is dissipated from the heat sink thus cooling the entire assembly. In addition, the thermal bonding agent is electrically insulating. Thus, contact with electrical components is acceptable and does not create the possibility of shorting between contacts and/or leads of these various components. Lastly, the thermal bonding agent is suitably pliable so as to conform and fill spaces surrounding the electrical components. During manufacturing, the thermal bonding agent becomes more pliable by the application of heat. A combination of heat and pressure are applied to the assembly, causing a thermal bonding agent to fill the spaces between the heat sink and circuit board, including those spaces surrounding the electrical components on the back side of the circuit board. Care is taken during this step to utilize an optimum thickness of thermal bonding material to insure that proper distribution of material is achieved without causing problems to circuit board operation. Specifically, care is taken to insure that back side components are not physically damaged, or their operation is effected in any way.

The assembly of the present invention may be further coupled with related systems to provide yet additional thermal management characteristics. More specifically, the circuit assembly of the present invention may be attached to a larger system back plane which may be liquid cooled. Consequently, both the heat sink and thermal liquid cooled back plane would provide cooling features to the circuit board.

It is an object of the present invention to provide a circuit board assembly which both allows for electrical components on the back side of the circuit board, while also providing an appropriate coupling with included heat sink. Using this type of assembly allows for the efficient management of thermal energy.

It is yet an additional object of the present invention to provide thermal management of a circuit board without effecting back side components that exist on the circuit board. Specifically, it is an object to provide heat dissipation mechanisms without physically damaging the back side components, or altering their electrical operating characteristics.

DETAILED DESCRIPTION OF THE INVENTION

Figure 1:
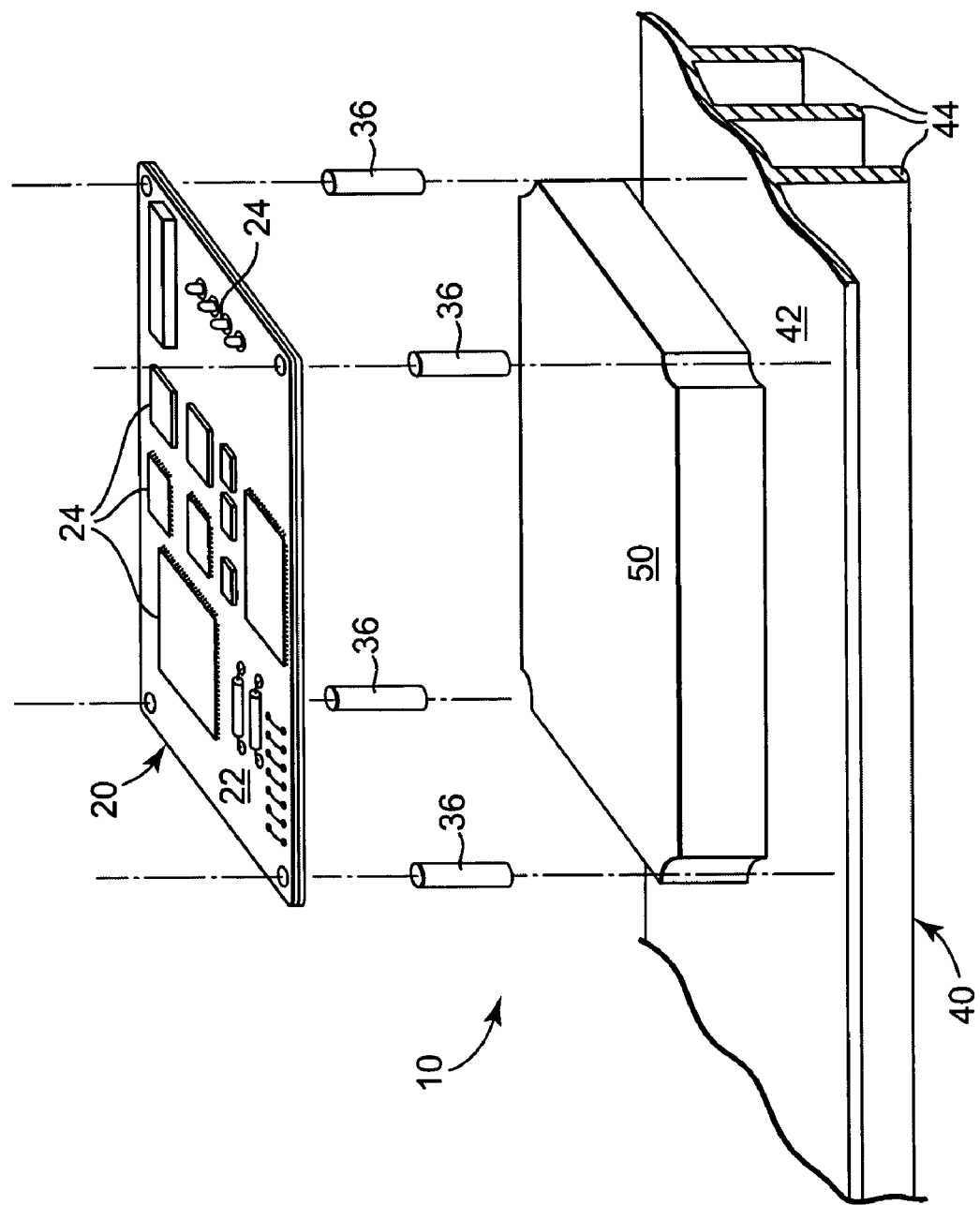
FIG. 1 is a perspective exploded view of the assembly of the present invention.

Referring now to FIG. 1, there is shown an exploded view of the circuit board assembly 10 of the present invention. The circuit board assembly 10 includes a circuit board 20 which includes a number of electrical components 24 attached to a front side 22. The nature of the various components could vary considerably. However, it is well understood by those skilled in the art that circuit boards of this type include several types of integrated circuits; including processors, memories, logic components, resistors, capacitors, etc. It is intended that the present application be equally applicable to any of these components.

Figure 2:
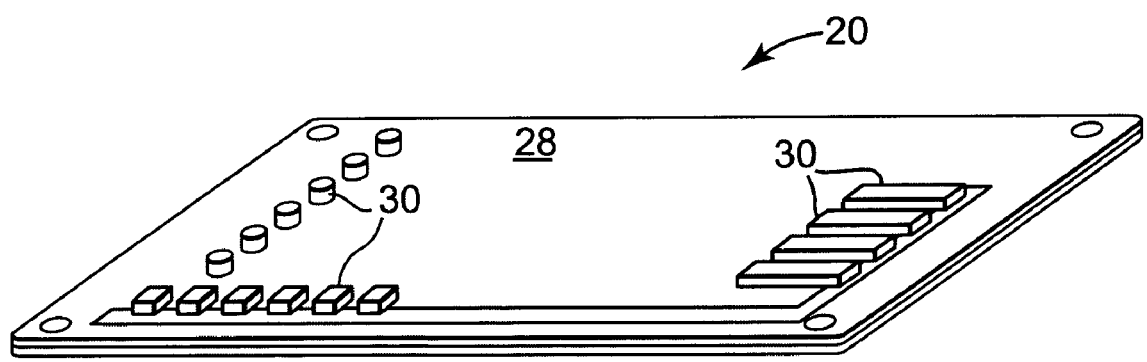
FIG. 2 is a perspective view of the back side of the circuit board.

Referring now to FIG. 2, the back side 28 of circuit board 20 is shown. The back side also includes a number of components 30 which are affixed and electrically connected to an appropriate portion on back side 28. It will be understood that these back side components 30 are typically decoupling capacitors and shunt resistors utilized in many circuit applications. That said, several alternatives may exist.

Also shown in FIG. 1 are a plurality of standoffs 36. Each of these standoffs provides a positioning type device to maintain a desired clearance between circuit board 20 and heat sink 40. In the exploded view of FIG. 1, some type of attachment screws or other appropriate device are utilized to attach circuit board 20 and standoffs 36 to heat sink 40. As also shown, heat sink 40 includes a mounting surface 42 and a plurality of fins 44. This type of heat sink structure is used in many applications, and is known to provide maximum surface area.

Referring now to thermal bonding material 50, this material is specifically chosen to be electrically insulating and thermally conductive. In that way, heat transfers accommodated between front side components 24 and back side components 30 to heat sink 40. In the preferred embodiment, this thermal bonding material 50 is a thermally transmissive bonding material sold by ARLON Materials for Electronics Division of Rancho Cucamonga, Calif. This thermal bonding material 50 is a ceramic-filled, woven glass/epoxy laminate and prepreg material with improved thermal conductivity. In addition to its thermal and electrical characteristics, the thermal bonding material 50 is pliable, especially when heated. Consequently, when heated, this material will surround electrical components 30 on the back side 28 of circuit board 20 during the manufacturing process.

Figure 4:
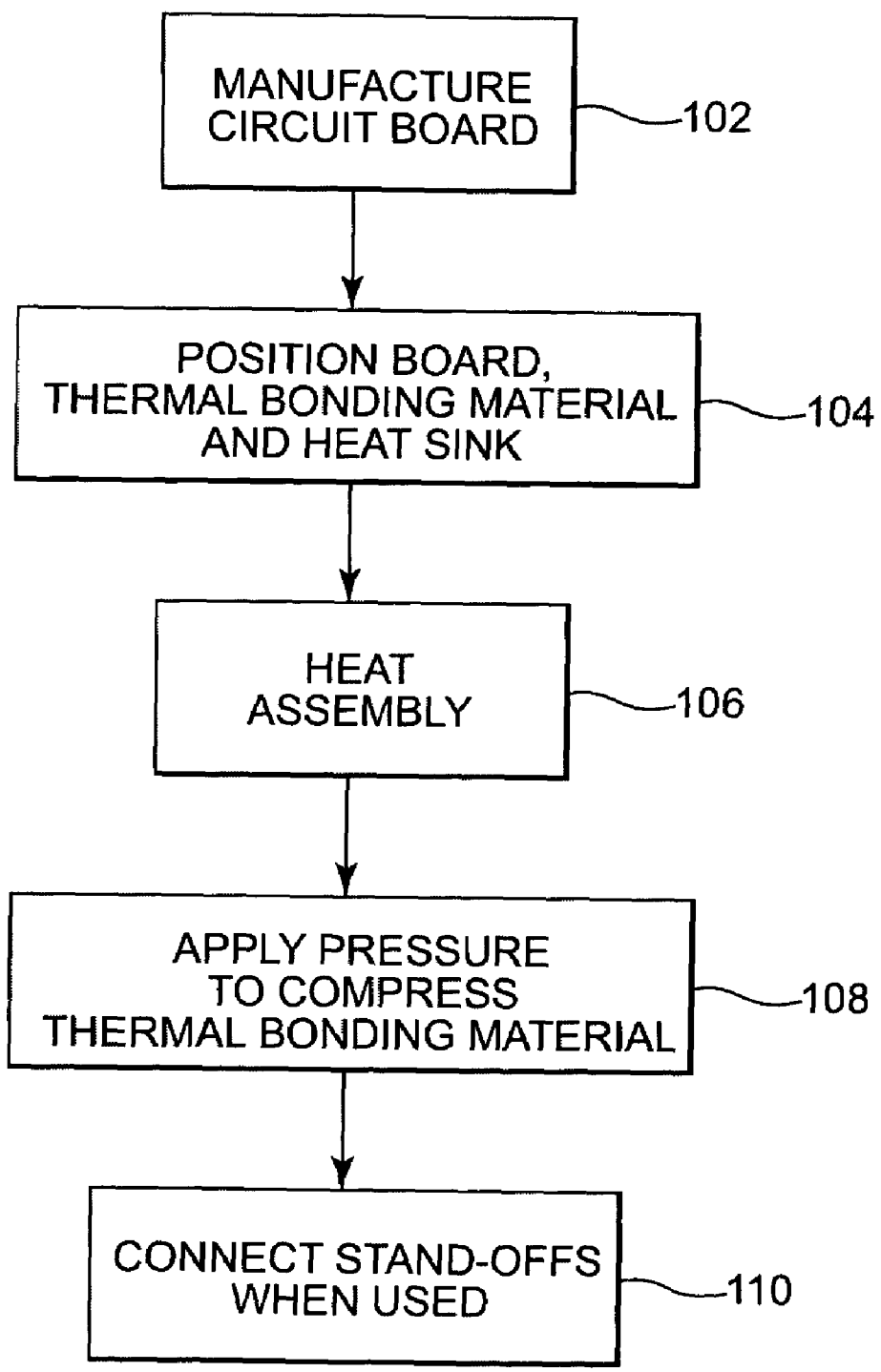
FIG. 4 is a flow chart illustrating the method of manufacturing the circuit assembly of the present invention.

Referring now to the actual manufacturing process. As outlined in the flow chart of FIG. 4, this process begins at step 102 wherein the circuit board is manufactured. As will be understood, this step of circuit board manufacturing is a complex process and involves many steps which are beyond the scope of this description. This process, however, is fairly easily carried out by those skilled in the art. Next, in step 104 the circuit board 20, thermal bonding material 50, and heat sink 40 are all positioned in a desired stack-up. This typically involves placing thermal bonding material 50 between circuit board 20 and heat sink 40. In addition, this step also involves the placement of desired standoffs and spacers where necessary. While not shown in the figures, fixturing is typically used in this process to appropriately hold and position all materials relative to one another. In the preferred embodiment, thermal bonding material 50 has a height larger than the spacer height.

Next, the process continues in step 106, wherein the entire assembly is heated. Shortly thereafter (or in conjunction with heating) pressure is applied to compress the thermal bonding material 50. Obviously, this pressure is applied between heat sink 40 and circuit board 20. Due to the pliable nature of the thermal bonding material 50, and the heating thereof, the thermal bonding material 50 will fill spaces between the circuit board 20 and heat sink 40. Further, the thermal bonding material will surround the back side components 30 to essentially encapsulate these elements. Where standoffs are used, the circuit board heat sink assembly is compressed to a point where standoffs make contact and provide the desired separation. At this point, the standoffs are connected in step 110 by using any desired connection methodology. For example, connection screws are typically utilized to connect the circuit board to the standoffs and standoffs to the heat sink. As this point, the circuit assembly is substantially complete and any additional finishing operations could be carried out. For example, circuit testing may be desired.

Figure 3:
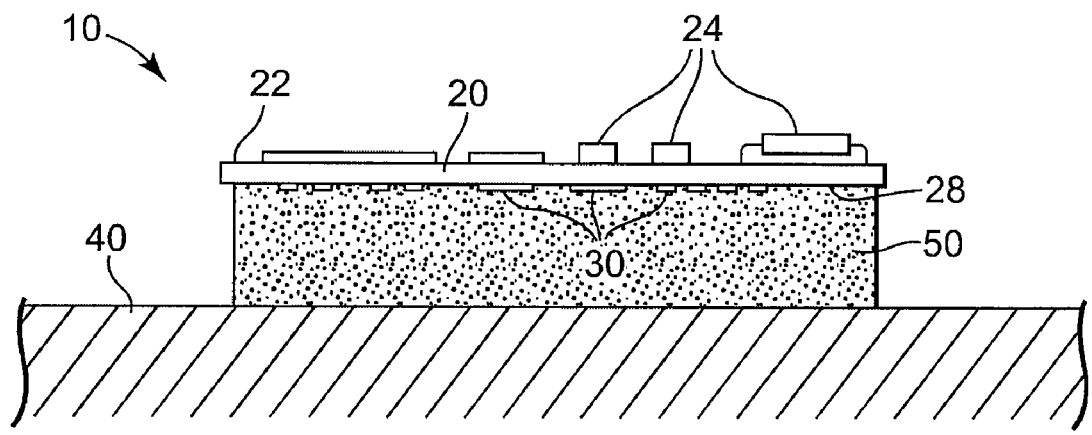
FIG. 3 and FIG. 3A are alternative cross-sectional views of the circuit assembly of the present invention.
Figure 3A:
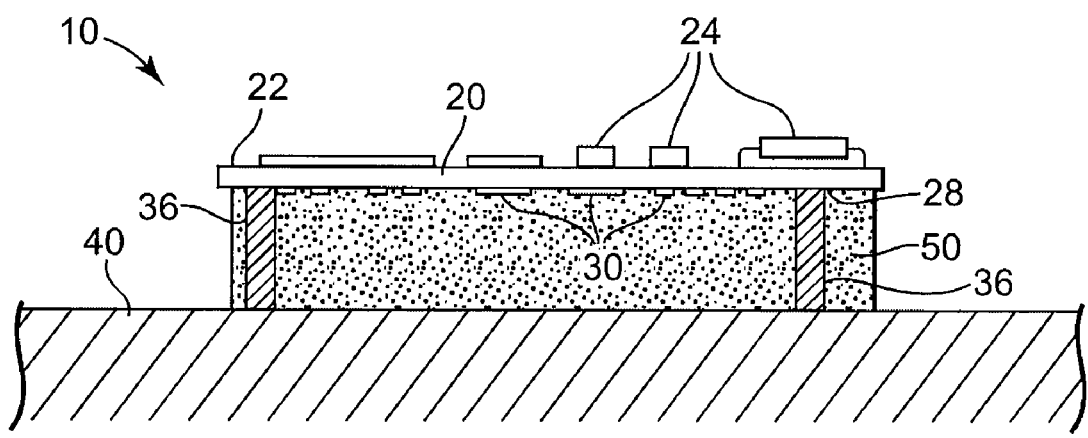

Once completed, the finished circuit assembly 10 is substantially shown in FIG. 3, which is a cross-sectional view. As can be seen, circuit board 20 includes a number of front side components 24 and a number of back side components 30. Thermal bonding material 50 is attached to the back side 28 of circuit board 20 and substantially surrounds backside components 30. Thermal bonding material 50 is also attached in contact with heat sink 40. (Note that FIG. 3 does not include or show any standoffs that may be used. It is understood, that standoffs could be utilized, however, in many different configurations.) Alternatively, FIG. 3A illustrates standoffs 36 as embedded and surrounded by thermal bonding material 50. As will be appreciated, this completed structure allow for heat to be transmitted to the heat sink 40, thus cooling the entire assembly. Naturally, other cooling structures could be used either in place of, or in conjunction with heat sink 40. For example, thermal bonding material 50 could be attached to a cooling manifold which is designed to accommodate a cooling fluid.

Figure 5:
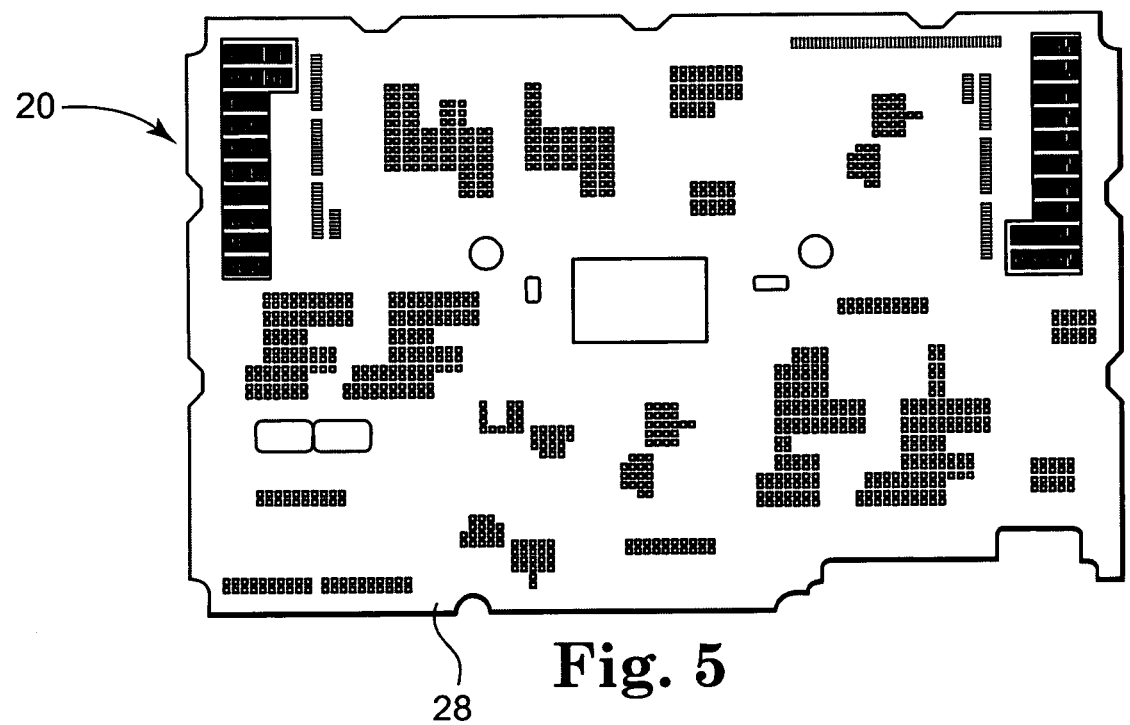
FIG. 5 is another perspective view of the back side of the circuit board.

As discussed above, the back side of the circuit board typically contains various resistors and capacitors used in the actual circuit application. In a preferred embodiment, these are 0201 sized resistors and capacitors, thus have fairly small dimensions. Shown in FIG. 5, is a perspective view of the back side of the circuit board, wherein each of these 0201 sized resistors are very small when compared to the overall circuit board size. As will be understood by those skilled in the art, 0201 components are typically 9–10 mils tall, thus do not take up a considerable amount of space. However, damage to any size component is possible when physically bonding any material thereto. Consequently, care is taken to avoid damage to these components when the thermal bonding material is configured to surround them.

Figure 6:
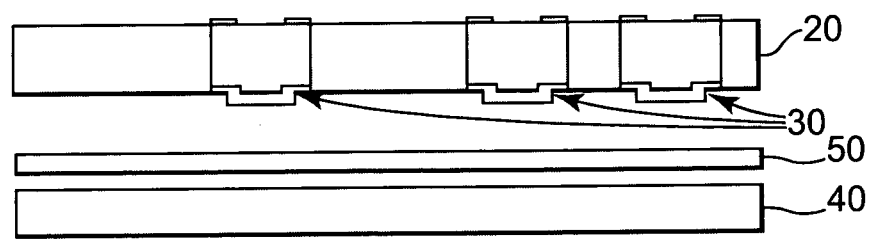
FIG. 6 is a cross-sectional view of the primary components of the circuit board assembly prior to bonding.

Referring to FIG. 6, there is shown an additional stack-up view of the circuit board thermal bonding material and heat sink, prior to their assembly. Again, in a preferred embodiment the thermal bonding material is initially sized to be 20 thousandths of an inch thick prior to compression. While not shown in this figure, a preferred standoff is used, which is also 20 thousandths thick. Consequently, any compression of the thermal bonding material will occur as it surrounds the electrical components, but does not otherwise resist in substantial compression. Naturally, the various dimensions and sizing can change drastically.

Figure 7:
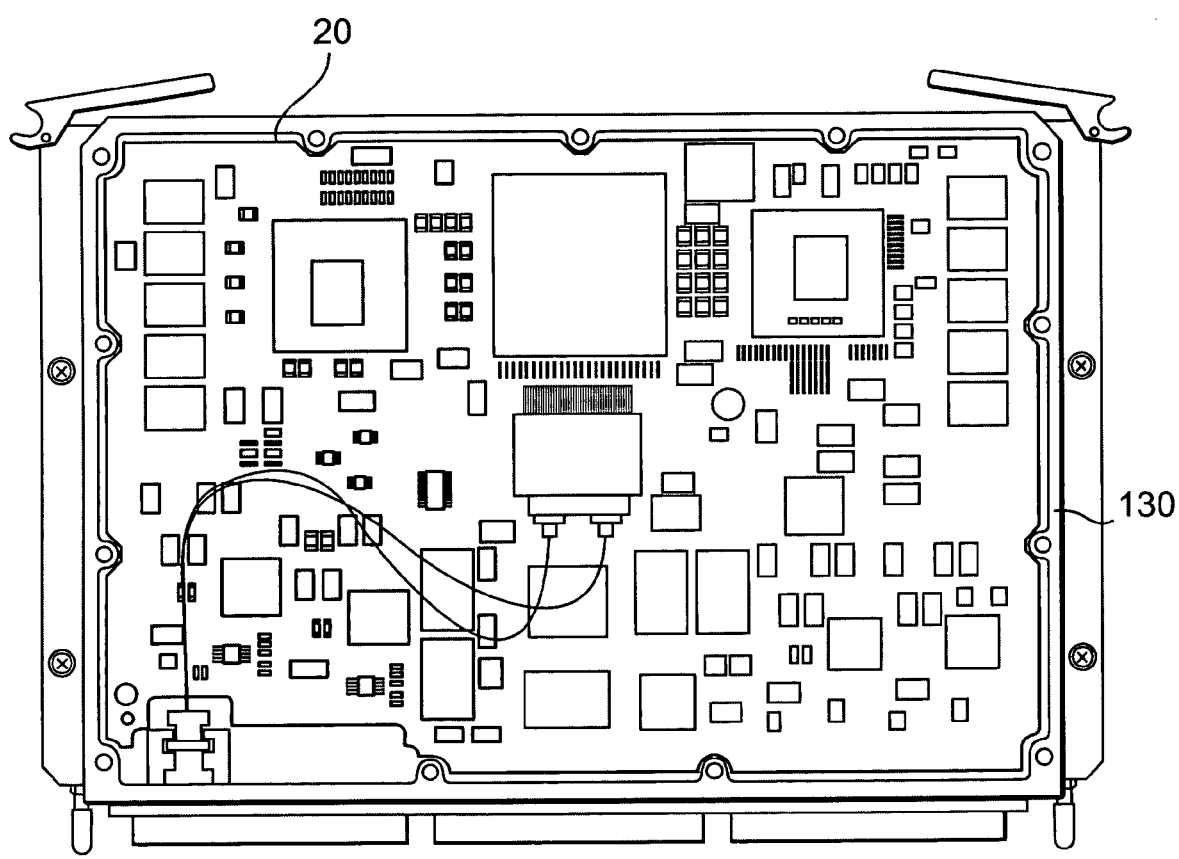
FIG. 7 is a top view of a final assembly which incorporates the circuit board assembly.

Lastly, shown in FIG. 7, is an example final assembly which utilizes the circuit board assembly of the present invention. As can be seen, circuit board 20 is included within a framework 130. As will be recognized, the heat sink is located behind circuit board 20. In this particular example, the final assembly is thus capable of being attached to a broader chassis or framework of some type.

While the various embodiments of the present invention have been shown and discussed above, it will be understood that many variations may exist. It is intended that all modifications and variations coming within the scope and spirit of the following claims are covered by the present invention. Further, the present invention is not limited to the specific embodiments shown and discussed.

What is claimed is:

1. A thermally efficient circuit assembly, comprising:
   a circuit board having electrical components attached to both a front side and a back side;
   a heat sink having heat dissipation capabilities to manage thermal energy; and
   a thermal bonding agent positioned between the circuit board and the heat sink and bonding the circuit board and the heat sink to one another, the thermal bonding agent substantially filling the space between the heat sink and the circuit board thus substantially surrounding the circuit components on the back side, wherein the thermally bonding agent is thermally conductive and electrically insulating.

2. The thermally efficient circuit assembly of claim 1 wherein the thermal bonding agent is a ceramic-filled, woven glass/epoxy laminate and prepreg material.

3. The circuit assembly of claim 1 wherein the circuit board has a plurality of standoffs attached to the back side thereof, and wherein the standoffs create physical contact between the circuit board and the heat sink while also configured to provide a distance between the heat sink and the circuit board so the electrical components do not contact the heat sink.

4. The circuit assembly of claim 3 wherein the standoffs are surrounded by the thermal bonding agent.

5. The thermally efficient circuit assembly of claim 4 wherein the thermal bonding agent is a ceramic-filled, woven glass/epoxy laminate and prepreg material.

6. The circuit assembly of claim 1 wherein the wherein the thermal bonding material is pliable when heated, thus able to substantially surround the electrical components.

7. The circuit assembly of claim 1 wherein the heat sink is a metal structure having a substantially planar surface attached to the thermal bonding material.

8. The circuit assembly of claim 1 wherein the heat sink has a back side surface which is sized to substantially cover the back side of the circuit board.

9. A circuit assembly, comprising:
   a circuit board having circuit components on a first side and a back side, the back side further having a plurality of standoffs attached thereto, each standoff of a predetermined height;
   a heat sink having heat dissipation capabilities, the heat sink positioned adjacent the back side of the circuit board and in contact with the standoffs; and
   a thermal bonding material attaching the circuit board to the heat sink such that the thermal bonding material surrounds the back side components and substantially fills the space between the back side of the circuit board and the heat sink, the thermal bonding material being thermally conductive, thus creating a thermal transmission path between the circuit board and the heat sink.

10. The circuit assembly of claim 9 wherein the thermal bonding material is a ceramic-filled, woven glass/epoxy laminate and prepreg material with improved thermal conductivity.

11. The circuit assembly of claim 9 wherein the standoffs are at least 20% taller than the tallest back side electrical component.

12. The circuit assembly of claim 9 wherein the standoffs are uniformly positioned on the back side of the circuit board.

13. The circuit assembly of claim 9 wherein the heat sink has a back side surface which is sized to substantially cover the back side of the circuit board.

14. A method of forming a thermally efficient circuit assembly, comprising:
   positioning a prefabricated two sided circuit board adjacent to a first side of a sheet of thermal bonding material and positioning a heat sink adjacent to the opposite side of the thermal bonding material wherein the side of the circuit board facing the thermal bonding material has a plurality of standoffs to provide clearance for circuit components attached to that side of the circuit board;
   applying pressure to the heat sink and the circuit board, thus sandwiching the thermal bonding material; and
   applying heat to the circuit board, thermal bonding material, and heat sink, allowing the thermal bonding material to become more pliable, thus allowing the standoffs to come in contact with the heat sink and causing the thermal bonding material to conform to spaces surrounding the circuit components and between the circuit board and heat sink, resulting in the attachment of the circuit board to the heat sink.

15. The method of claim 14 wherein the thermal bonding material is a ceramic-filled, woven glass/epoxy laminate and prepreg material with improved thermal conductivity.

16. The method of claim 14 wherein the standoffs are at least 20% taller than the tallest component on the side of the circuit board facing the heat sink.

17. The method of claim 14 wherein the circuit board and the heat sink are sized substantially similarly, such that he step of sandwiching causes the boding material to cover substantially the entire surface of both the circuit board and the heat sink.

* * * * *

UNITED STATES PATENT AND TRADEMARK OFFICE
CERTIFICATE OF CORRECTION

| | | |
|---|---|---|
| PATENT NO. | : 7,176,707 B1 | Page 1 of 1 |
| APPLICATION NO. | : 11/360248 | |
| DATED | : February 13, 2007 | |
| INVENTOR(S) | : Gary L. Hokenson | |

It is certified that error appears in the above-identified patent and that said Letters Patent is hereby corrected as shown below:

Column 5, line 49, delete the first occurrence of "wherein the".

Column 6, line 56, delete "he" and insert --the--.

Column 6, line 57, delete "boding" and insert --bonding--.

Signed and Sealed this

First Day of May, 2007

JON W. DUDAS
*Director of the United States Patent and Trademark Office*